(12) United States Patent
Fon et al.

(10) Patent No.: US 11,909,414 B2
(45) Date of Patent: Feb. 20, 2024

(54) CONTROL OF ANALOGUE TO DIGITAL CONVERTERS

(71) Applicant: Nordic Semiconductor ASA, Trondheim (NO)

(72) Inventors: Henrik Fon, Trondheim (NO); Tor Øyvind Vedal, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/824,108

(22) Filed: May 25, 2022

(65) Prior Publication Data

US 2022/0385299 A1 Dec. 1, 2022

(30) Foreign Application Priority Data

May 26, 2021 (GB) ...................................... 2107505

(51) Int. Cl.
*H03M 1/12* (2006.01)
*H03M 1/38* (2006.01)
*H03K 19/17736* (2020.01)

(52) U.S. Cl.
CPC .......... *H03M 1/38* (2013.01); *H03K 19/1774* (2013.01); *H03M 1/125* (2013.01)

(58) Field of Classification Search
CPC ..... H03M 1/38; H03M 1/125; H03K 19/1774
USPC ................................ 341/118, 120, 155, 143
See application file for complete search history.

(56) References Cited

U.S. PATENT DOCUMENTS

| 8,072,180 | B1* | 12/2011 | Sachs | ................ | G01R 19/2506 |
| | | | | | 318/807 |
| 2003/0020442 | A1* | 1/2003 | Hwang | ............ | H02M 3/33523 |
| | | | | | 323/288 |
| 2004/0091273 | A1* | 5/2004 | Brissette | ............... | H04L 25/063 |
| | | | | | 398/175 |
| 2018/0256242 | A1* | 9/2018 | Bluvshtein | ........ | H02M 7/53871 |

FOREIGN PATENT DOCUMENTS

WO  WO 2020/173225 A1  9/2020

OTHER PUBLICATIONS

IPO Combined Search and Examination Report under Sections 17 and 18(3) for GB2107505.6, dated Feb. 25, 2022, 11 pages.
Lee, "Power and Bandwidth Scalable 10-b 30-MS/s SAR ADC," *IEEE Transactions on Very Large Scale Integration (VLSI) Systems*, vol. 23, No. 6, Jun. 2015, pp. 1103-1110.

* cited by examiner

*Primary Examiner* — Peguy Jean Pierre
(74) *Attorney, Agent, or Firm* — Klarquist Sparkman, LLP

(57) ABSTRACT

A circuit portion comprising a clock domain is disclosed. A first clock is arranged to clock components in the clock domain. An analogue to digital converter is clocked by a second clock with a duty cycle. The second clock is derived from the first clock. The analogue to digital converter is arranged to output a feedback signal upon finishing a conversion of a sample, and the feedback signal is arranged to control the duty cycle.

13 Claims, 3 Drawing Sheets

CONTROL OF ANALOGUE TO DIGITAL CONVERTERS

CROSS-REFERENCE TO RELATED APPLICATION

This application claims priority from United Kingdom Patent Application No. 2107505.6, filed May 26, 2021, which application is incorporated herein by reference in its entirety.

This invention relates to the operation of analogue to digital converters, particularly although not exclusively, Successive Approximation Register Analogue to Digital Converters (SAR ADCs), which convert analogue waveforms into a corresponding digital representation.

A typical SAR ADC comprises a Successive Approximation register (SAR) which feeds multi-bit binary codes into a digital to analogue converter (DAC). During an analogue to digital conversion the SAR ADC performs a binary search to find the correct digital input to the DAC. The sampling and conversion phase of the SAR ADC is controlled by an associated sampling clock. The conversion phase takes a certain amount of time, typically in the range of nanoseconds to microseconds and it is important that the SAR ADC finishes the conversion before a new sampling phase starts.

The Applicant has recognised that determining the correct duty cycle for the sampling clock is difficult as it involves a trade-off. If the SAR ADC finishes the sample conversion quickly, then the surplus time is spent doing nothing before the sampling phase begins. However, if the SAR ADC is too slow, for any particular reason, there may not be enough time in the conversion phase to convert all the bits. Bits may be lost if the sampling phase is entered before all the bits of a sample are converted. Losing bits can dramatically affect the performance of SAR ADCs in particular.

When viewed from a first aspect, the present invention provides a circuit portion, comprising:
- a clock domain comprising a first clock arranged to clock components in the clock domain;
- an analogue to digital converter clocked by a second clock having a duty cycle, the second clock being derived from the first clock;
- wherein the analogue to digital converter is arranged to output a feedback signal upon finishing an analogue to digital conversion of a sample, said feedback signal being arranged to control the duty cycle.

Thus it will be seen that, in accordance with the invention, by controlling the duty cycle of the second clock (the clock which clocks the analogue to digital converter (ADC)), the ADC may be clocked with a dynamic duty cycle. The duty cycle is controlled by the feedback signal which is output upon finishing an analogue to digital conversion of a sample. As will be explained below, this provides greater flexibility and may allow the trade-off set out above to be avoided.

Typically, if an ADC completes an analogue to digital conversion quickly, there will be unnecessary surplus time spent in the conversion phase. The Applicant has recognised that this surplus time could instead be spent on improving settling time during the sampling phase. Therefore, in accordance with embodiments of the invention, if the ADC finishes the sample conversion quickly, the duty cycle may be increased so that more time can be spent on improving settling time during the sampling phase. This may improve linearity of the ADC—an important parameter of high-resolution ADCs.

If the ADC is too slow, then this may compensated for by changing the duty cycle so that no bits are lost. A number of factors can affect the speed of an ADC. Some examples include ageing of the ADC, parasitic capacitances in the ADC, or a low supply voltage to the ADC. In accordance with embodiments of the invention, if the ADC is slow, the duty cycle may be reduced to allow for more conversion time. This helps ensure that all bits of a sample are converted. The ability to avoid losing bits is particularly important for the performance of an SAR ADC. In a worst case scenario, the signal-to-noise-distortion ratio (SNDR) may drop by −6 dB per bit for every bit lost (not taking into account oversampling or averaging of data).

Furthermore, having the ability to change the duty cycle of the second clock (i.e. the clock clocking the ADC) allows the energy efficiency of the ADC to be improved. Typically, a sampling clock will have some variation in its duty cycle around a nominal value. An ADC, therefore, typically needs to be fast enough to handle these variations. With a dynamic duty cycle in accordance with the invention, however, the ADC can be designed using a nominal value of the duty cycle. Should the actual duty cycle be higher than the nominal value, then the ADC may dynamically lower the duty cycle back to the nominal value or lower. This can be an effective power saving method as slower ADCs (which consume less power) can be used and compensated for by dynamically lowering the duty cycle.

In this way, embodiments in accordance with the invention help to improve the robustness of the ADC—e.g. reducing the ADC's sensitivity to variability. A dynamic duty cycle for clocking an ADC may help to ensure that the ADC always outputs every bit of a sample, while maximizing the sampling time available for the next sampling phase.

The second clock may be referred to as a 'local' sampling clock for clocking the ADC. Similarly, the first clock may be referred to as a 'global' clock from which the local sampling clock is derived. The first clock may have a constant duty cycle—e.g. 50%. It is to be understood that the second clock has a duty cycle that may change depending on the feedback signal, i.e. the feedback signal indicating how quickly the ADC completes an analogue to digital conversion. Although any signal or clock may have a duty cycle, when reference is made herein to the duty cycle, this is referring to the duty cycle of the first clock.

In a set of embodiments, the second clock determines when the ADC changes from a conversion mode to a sampling mode. For example, while the second clock is in a first state (e.g. high) the ADC may be in sampling mode and when the second clock is in a second state (e.g. low) the ADC may be in conversion mode. In a set of embodiments, controlling the duty cycle of the second clock in turn controls the duration of the sampling mode and the duration of the conversion mode. For example, increasing the duty cycle of the second clock may reduce the duration of the conversion mode and increase the duration of the sampling mode. Similarly, decreasing the duty cycle of the second clock may increase the duration of the conversion mode and decrease the duration of the sampling mode.

In a set of embodiments, the feedback signal comprises a signal edge which is triggered upon the ADC finishing an analogue to digital conversion of a sample. For example, the feedback signal may have a rising edge triggered by completion of an analogue to digital conversion of a sample. Therefore, the feedback signal effectively indicates when the ADC has completed its conversion and is ready to enter the next sampling phase.

In an example set of embodiments, when the ADC finishes conversion of a sample, a rising edge of the feedback signal is triggered and the feedback signal stays high until the ADC enters sampling mode (e.g. when the local sampling clock goes high). In this example set of embodiments, on entering the sampling mode (i.e. for the next sampling phase), a falling edge of the feedback signal is triggered and the signal will stay low until the conversion of the next sample is finished.

The feedback signal may control the duty cycle in any suitable way. In a set of embodiments, the duty cycle is determined by a signal edge of the feedback signal. For example, the second clock may have a signal edge triggered by a rising signal edge of the feedback signal. This means that the second clock, which clocks the ADC, may wait for confirmation that an analogue to digital conversion of a sample is completed before it changes. This helps to ensure that the ADC may only enter the sampling mode when all the bits of the sample have been converted.

In a set of embodiments, a first signal edge of the second clock is triggered by a signal edge of the feedback signal and a second signal edge of the second clock is triggered by a signal edge of the first clock. For example, a rising signal edge of the second clock may be triggered by a (e.g. rising) signal edge of the feedback signal and a falling signal edge of the second clock may be triggered by a (e.g. falling) signal edge of the first clock. Therefore, the second signal edge of the second clock (e.g. the falling edge of the clock clocking the ADC) is advantageously "precise" with good accuracy and low jitter. This helps to stop the sampling mode (or sampling phase) at a known reference point in time. Synchronising the second signal edge (e.g. falling edge) of the second clock with a signal edge (e.g. a falling edge) of the first clock helps to ensure good enough jitter performance on the signal edge of the second clock.

In a set of embodiments, the circuit portion comprises a sampling module. The sampling module may be clocked by the second clock. In a set of embodiments, an output of the ADC is sampled by the sampling module. Said output may be the result of the analogue to digital conversion. In a set of embodiments, the sampling module comprises a flip flop—e.g. a D-type flip flop.

In a set of embodiments, the circuit portion comprises a re-sampling module. The re-sampling module may be clocked by the first clock. In a set of embodiments, an output of the sampling module is re-sampled by a re-sampling module. Similarly to the sampling module, in a set of embodiments, the re-sampling module comprises a flip flop—e.g. a D-type flip flop. A (e.g. rising) signal edge of the second clock (e.g. the local sampling clock) may be difficult to model using digital tools. For example, digital tools may have difficulties modelling the behaviour of a clock having a signal edge that is set by the actual ADC speed. It may be easier, however, for digital tools to use the first (e.g. global clock) for re-sampling the output of the sampling module, as this clock may have better known behaviour. For example, both analogue and digital domains may agree when a falling signal edge of the global clock occurs.

Any suitable ADC may be used in accordance with the invention. For example, the Applicant envisions that flash ADCs, for which speed is a priority, may benefit from the duty cycle control described herein. In a set of embodiments, the ADC is a Successive Approximation Register Analogue to Digital Converter (SAR ADC). As SAR ADCs output one bit at a time, it is especially advantageous to help ensure that the duty cycle of the second clock (e.g. the local sampling clock) is controlled such that all bits of a sample are converted before the ADC begins to sample the next analogue input.

In a set of embodiments, the ADC comprises one or more internal latches, each internal latch being arranged to latch a bit once said bit has been converted. This helps to ensure that the converted bits are stable at any time. In a set of such embodiments, the internal latch(es) only reset on a signal edge of the second clock, for example, on the falling edge of the second clock. Therefore, converted bits of a sample may be held stable until the ADC is ready to convert the next sample. This also allows the ADC output to be re-sampled by the first clock after being sampled by the second clock.

Features of any aspect or embodiment described herein may, wherever appropriate, be applied to any other aspect or embodiment described herein. Where reference is made to different embodiments or sets of embodiments, it should be understood that these are not necessarily distinct but may overlap.

Certain preferred embodiments of the invention will now be described, by way of example only, with reference to the accompanying drawings, in which.

Figure 1:
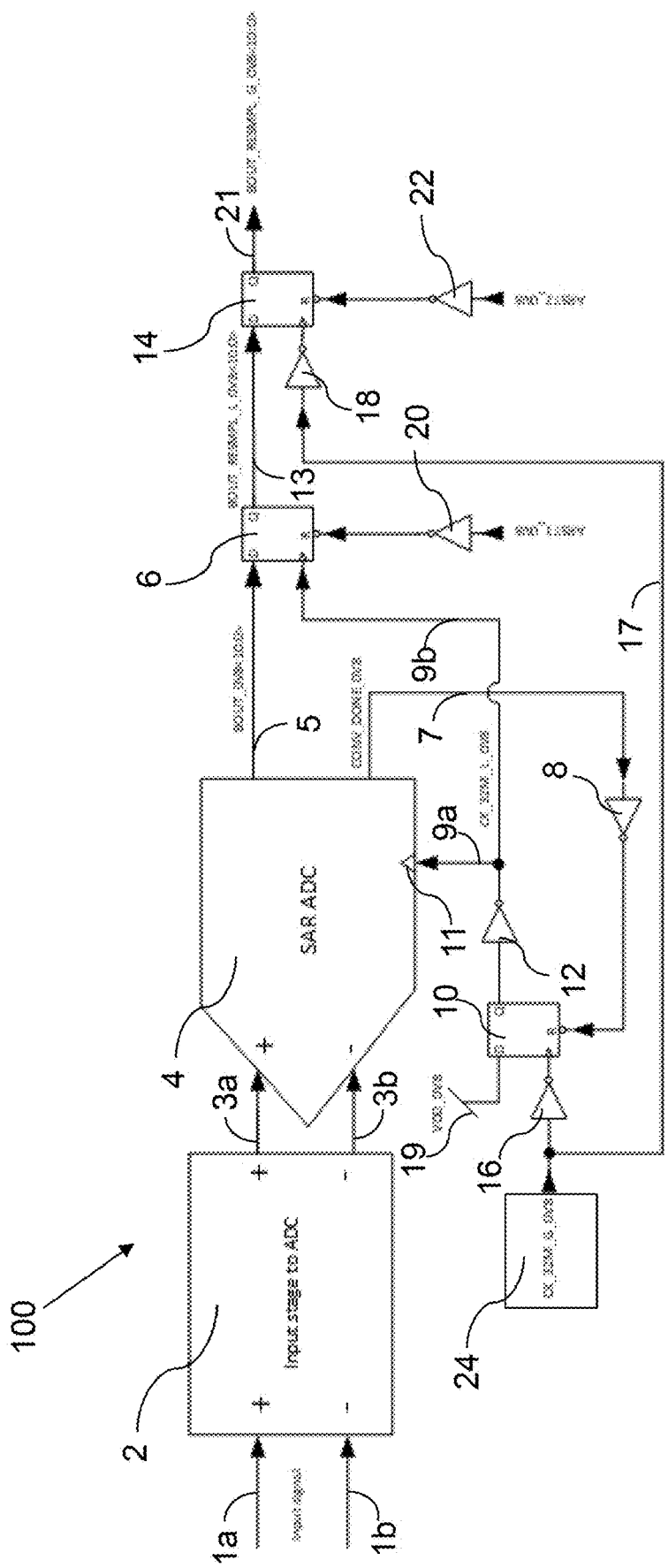
FIG. 1 is a schematic of a circuit portion in accordance with an embodiment of the invention.

FIG. 1 shows a schematic of a circuit portion 100 in accordance with an embodiment of the invention. The circuit portion 100 comprises an 11-bit Successive Approximation Register Analogue to Digital Converter (SAR ADC) 4. The circuit portion 100 comprises a first, global clock 24. The global clock 24 is a 32 MHz clock with a 50% duty cycle. However, the global clock 24 may have any frequency and duty cycle. The SAR ADC 4 is clocked by a second, local sampling clock 9a, 9b derived from the global clock 24. As will be explained below, the local sampling clock 9a, 9b has a dynamic duty cycle.

An input stage 2 receives a differential input signal through a differential input 1a, 1b. The SAR ADC 4 receives a differential input connected to the differential output 3a, 3b of the input stage 2. Two signal lines 5, 7 are output from the SAR ADC 4. The uppermost output 5 from the SAR ADC 4 is fed to a sampling module 6 comprising a D-type flip flop. The sampling module output 13 is fed to a re-sampling module 14 which also comprises a D-type flip flop. A signal line 17 connects the global clock 24 to the clock input of the re-sampling module 14 via an inverter 18. The reset input of the sampling module 6 and re-sampling module 14 are each respectively controlled by reset signals generated elsewhere in the circuit via respective inverters 20, 22. The re-sampling module comprises an output 21 which may be connected to any suitable circuit component or further circuit portion (not shown).

The lowermost output 7 from the SAR ADC 4 is fed to the reset input of a flip flop 10 via an inverter 8. This flip flop 10 is clocked by the global clock 24. The global clock 24 is connected to the clock input of the flip flop 10 via an inverter 16. The data input of the flip flop 10 is connected to the positive power supply rail 19. The output of the flip flop 10 is connected to an inverter 12. The output of this inverter 12 carries the local sampling clock signal 9a, 9b to the clock terminal 11 of the SAR ADC 4 and the clock input of the sampling module 6.

Figure 2:
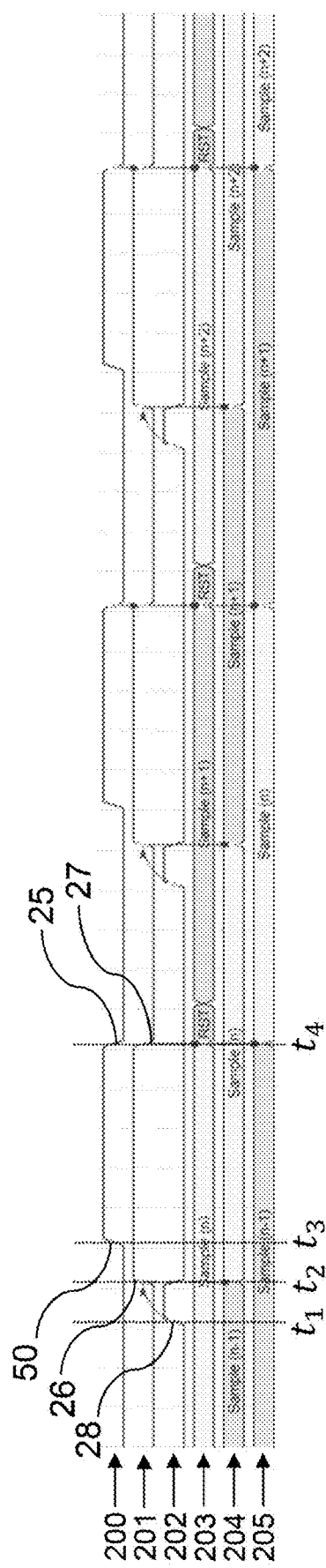
FIG. 2 is a timing diagram showing how the dynamic duty cycle may be increased.
Figure 3:
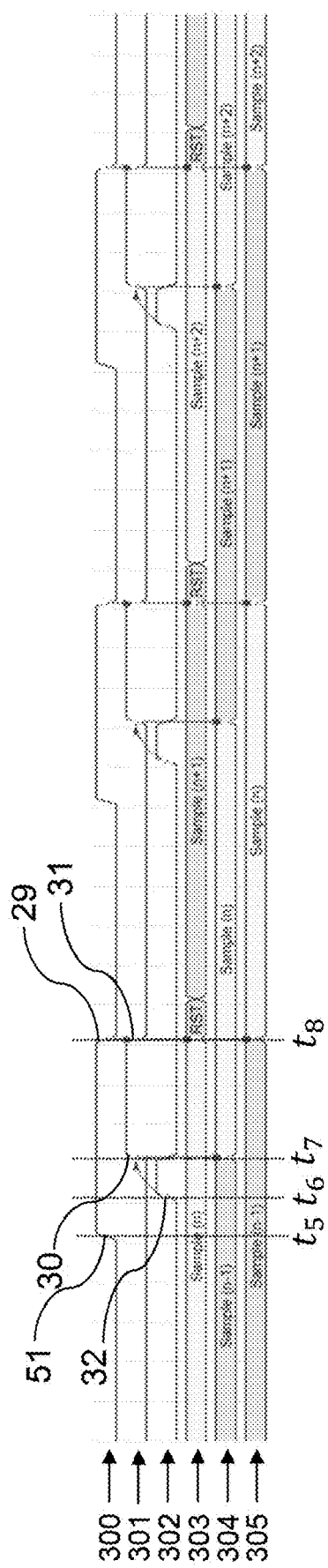
FIG. 3 is a timing diagram showing how the dynamic duty cycle may be reduced.

Operation of the circuit will now be described with additional reference to FIGS. 2 and 3 which depict timing diagrams for two different scenarios. FIG. 2 shows how the duty cycle of the local sampling clock 9a, 9b is affected by a fast ADC and FIG. 3 shows how it is affected by a slow ADC.

On both diagrams the uppermost line 200, 300 represents the global clock 24. The second line 201, 301 represents the local sampling clock 9a, 9b which has a dynamic duty cycle as will be explained in more detail below. The third line 202, 302 represents the feedback signal which is carried from the lowermost output 7 of the SAR ADC 4 and indicates when an analogue to digital conversion of a sample has been completed. The fourth line 203, 303 represents the uppermost output 5 from the SAR ADC 4—i.e. the digital result of the analogue to digital conversion. The fifth line 204, 304 represents the output 13 from the sampling module 6. The sixth line labelled 205, 305 represents the output 21 from the re-sampling module 14. The lowermost three lines 203-205, 303-305 in FIGS. 2 and 3 show labels indicating which 'sample' (e.g. sample n−1, sample n, sample n+1 etc.) is being output at each point. Here, n may be any integer and represents a sample number. For example, sample n may be followed by sample n+1, i.e. the next sample.

The circuit portion 100 shown in FIG. 1 converts an analogue input signal (at 1a, 1b) into an equivalent digital representation. The input stage 2 shown in FIG. 1 comprises a circuit for conditioning the analogue input signal (at 1a, 1b) so that it meets the requirements for the ADC 4. The input stage 2 then feeds the conditioned signal to the SAR ADC 4 during sampling (via the differential input 3a, 3b). When the SAR ADC 4 begins sampling, the input stage 2 ensures the signal is "strong" enough to ensure that the signal to the ADC 4 settles—e.g. the input stage may comprise an amplifier (not-shown). Non-complete settling will result in non-linearities which can poorly affect performance.

The ADC 4 converts the analogue signal to a digital signal asynchronously, by sampling the analogue input in a sampling mode, carrying out the conversion during a conversion mode and outputting the digital equivalent when the conversion is done. The time spent in the sampling mode and the conversion mode is determined by the sampling clock clocking the ADC 4 (in this case, the local sampling clock 9a, 9b). The global clock 24 (upper trace 200, 300 in FIGS. 2 and 3) is used in the digital domain for processing the data from the ADC output 5. The output 21 of the circuit portion 100, i.e. the digital signal resulting from the conversion of the analogue sample, may go on to be used elsewhere for digital processing for a wide range of potential applications.

The circuit portion 100 generates a local sampling clock 9a, 9b (second trace 201, 301) which is only used by the SAR ADC 4 and the sampling module 6 (i.e. the D flip-flop connected to the output of the ADC 4) to clock the bits out from the ADC 4.

In the embodiment of FIG. 1, the ADC 4 outputs a feedback signal (202, 302) via its lowermost output 7 which indicates when it has finished a sample conversion. Whenever the ADC 4 finishes an analogue to digital conversion of a sample (e.g. sample n), the feedback signal goes high (e.g. see the rising edge 28 of line 202 FIG. 2) and stays high until the ADC 4 enters sampling mode (e.g. see the rising edge 26 of line 201 of FIG. 2) where the next sample (e.g. sample n+1) is obtained from the input stage 2. On entering sampling mode, the feedback signal goes low again and stays low until the next sample conversion is finished.

The flip flop 10 connected to the clock input 11 of the SAR ADC 4 is where the duty cycle of the local sampling clock 9a, 9b is determined. A rising edge at the clock input of the flip flop 10 triggers a rising edge of the Q output and a falling edge at the reset input triggers a falling edge at the Q output (with some delay).

Because of the inverters 8, 12, 16 the rising edge of the feedback signal triggers the rising edge of the local sampling clock 9a, 9b and the falling edge of the global clock 24 triggers the falling edge of the local sampling clock 9a, 9b. This is demonstrated in both the timing diagrams shown in FIGS. 2 and 3. It is to be understood that, although the timing diagrams of FIGS. 2 and 3 show the feedback signal 202, 302 having a certain pulse-width, the actual pulse-width may be much smaller (e.g. substantially negligible). This means that the delay of the rising edge 26, 30 of the local sampling clock 9a, 9b after it is triggered by the rising edge 28, 32 of the feedback signal 202, 302 also may be much smaller (e.g. substantially negligible). The particular pulse-width of the feedback signals 202, 302 shown in FIGS. 2 and 3 is exaggerated for illustrative purposes only.

In FIGS. 2 and 3, it may be seen that the SAR ADC 4 controls the rising edge 26, 30 of the local sampling clock 201, 301 using the feedback signal 202, 302 which goes high (at time $t_1$ in FIG. 2 and at time $t_6$ in FIG. 3). The local sampling clock 201, 301 to the ADC 4 goes high after the ADC 4 finishes a conversion, which results in the ADC 4 going to sampling mode. When the ADC 4 goes to sampling mode after converting a sample (e.g. sample n), the ADC 4 moves on to the next sample, (e.g. sample n+1) (see line 203 and 303).

As can be seen in FIGS. 2 and 3, the falling edge 27, 31 of the local sampling clock 201, 301 is synchronized with the falling edge 25, 29 of the global clock 200, 300 at time $t_4$ and $t_8$. The falling edge 27, 31 of the local sampling clock 201, 301 defines the end of the sampling mode and the beginning of the conversion mode (i.e. for the sampling and conversion of sample n+1).

The ADC 4 comprises internal latches (not shown) which latch bits once they are converted (so the converted bits are stable at any time). These internal latches will only reset on the falling edge 27, 31 of the local sampling clock 201, 301 at time $t_4$ and $t_8$ (see RST in FIGS. 2 and 3).

When the ADC 4 finishes a conversion, the local sampling clock 201, 301 goes high. The bits output from the SAR ADC 4 are then sampled via the sampling module 6 that is clocked by the local sampling clock 9a, 9b.

However, in this example, the rising edge of the local sampling clock 9a, 9b has too much variability to be used by the digital domain, so the bits output from the sampling module 6 (204, 304) are re-sampled by the re-sampling module 14 which is clocked by the global clock 200, 300.

The re-sampling occurs on the falling edge 25, 29 of the global clock 200, 300 which is synchronized to the falling edge 27, 31 of the local sampling clock 201, 301 (e.g. at time $t_4$ and $t_8$). This helps to ensure good enough jitter performance for the ADC 4 on the falling edge 27, 31 of the local sampling clock 9a, 9b. The falling edge 27, 31 of the local sampling clock 9a, 9b (201, 301) is when the sampling mode ends and the conversion mode begins. To meet linearity requirements, the sampling time has to be well-defined in time.

Turning specifically to FIG. 2, at time $t_1$ the feedback signal 202 goes high (indicating that an analogue to digital conversion is done). The rising edge 28 of the feedback signal 202 triggers the rising edge 26 of the local sampling clock 201, which goes high at time $t_2$. The global clock 200 goes high at time $t_3$. In FIG. 2, the rising edge 26 of the local sampling clock 201, at time $t_2$, precedes the rising edge 50 of the global clock 200. At time $t_4$, the falling edge of the local sampling clock 201 is synchronised with the falling edge of the global clock 200, defining the end of the sampling mode. The feedback signal 202 going high before the rising edge of the global clock 24 indicates that the ADC 4 is fast. In such a case, the circuit portion 100 has dynamically increased the settling time available during the sampling phase by increasing the duty cycle of the local sampling clock 201. This increases the duration of the sampling mode and decreases the duration of the conversion mode.

Now turning to FIG. 3, it can be seen that at time $t_5$, the global clock 300 goes high before the feedback signal 302 goes high at time $t_6$. The rising edge 32 of the feedback signal 302 triggers the rising edge 30 of the local sampling clock 301, which goes high at time $t_7$. FIG. 3 shows how the duty cycle is dynamically reduced by delaying the rising edge 30 of the local sampling clock 301, with respect to the rising edge of the global clock 300). At time $t_8$, the falling edge of the local sampling clock 301 is synchronised with the falling edge of the global clock 300, defining the end of the sampling mode. The feedback signal 302 going high after the rising edge of the global clock 24 indicates a slow ADC 4. In such a case, the circuit portion 100 lowers the duty cycle (see line 301), allowing the ADC 4 to finish the conversion of all bits of the sample. This decreases the duration of the sampling mode and increases the duration of the conversion mode. This is at the expense of slightly increased settling time. However, this outcome is preferable as in a worst-case scenario for Nyquist ADCs (i.e. assuming no averaging of data or oversampling etc.) each bit lost may result in −6 dB of signal-to-noise-distortion ratio (SNDR). This is expected to be much larger than the error due to insufficient settling.

The embodiment shown in FIG. 1 allows the SAR ADC 4 to be clocked by a dynamic duty cycle instead of a fixed duty cycle. This has been identified by the Applicant to solve several problems.

First of all, the settling time for the input stage 2 feeding an input signal (via the differential input 3a, 3b) to the SAR ADC 4 during sampling is maximized since time spent for conversion is minimized. This helps to improve linearity of the ADC.

Secondly, in accordance with the embodiment shown in FIG. 1, the robustness of the SAR ADC 4 increases dramatically as the arrangement prevents the loss of bits due to unforeseen circumstances—e.g. ageing of the ADC 4, parasitic capacitances in the ADC 4, a low supply voltage to the ADC 4 etc. Losing bits is known to be dramatically detrimental to performance.

Thirdly, the energy efficiency of the ADC 4 may be improved. For example, ADC duty cycle variations are normally ±5%. Typically, it is assumed that the ADC 4 is fast enough to handle duty cycles of up to 50%. The conversion time is typically proportional to $T_s(1-DUC)$, where $T_s$ represents the sampling period and DUC represents the duty cycle. Therefore, the difference between a 55% and 50% duty cycle means a corresponding speed difference of approximately $(1-50)/(1-55)=11\%$. If frequency and power are proportional, then a similar proportion may be saved in power. If the ADC 4 is designed to handle a maximum of a 45% duty cycle, then the speed requirement is reduced by roughly 22%. This means that if the ADC 4 is designed to handle a lower duty cycle (e.g. 45-50%) less power may be used by the ADC 4. Therefore, a slower ADC 4 may be used than would typically be selected as the duty cycle of the local sampling clock 9a, 9b can be controlled (e.g. reduced) to allow for more conversion time. Reducing the speed requirement of the ADC (e.g. by 11%-22%), thus, helps to improve its energy efficiency.

Losing bits is especially unfortunate. As mentioned above, in a worst-case scenario for SAR ADCs (in particular, Nyquist ADCs) the signal-to-noise-distortion ratio (SNDR) may drop by −6 dB for every bit lost (i.e., the SNDR may be halved for one lost bit, assuming noise is negligible for SNDR of interest).

The described embodiment solves these problems by controlling the duty cycle of the local sampling clock 9a, 9b. The circuit portion 100 of FIG. 1 is arranged to allow this dynamic control.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A circuit portion, comprising:
   a clock domain comprising a first clock arranged to clock components in the clock domain;
   an analogue to digital converter clocked by a second clock having a duty cycle, the second clock being derived from the first clock;
   a sampling module arranged to sample an output of the analogue to digital converter, wherein the sampling module is clocked by the second clock;
   a re-sampling module clocked by the first clock arranged to re-sample the output of the sampling module; and
   wherein the analogue to digital converter is arranged to output a feedback signal upon finishing an analogue to digital conversion of a sample, said feedback signal being arranged to control the duty cycle.

2. The circuit portion of claim 1, wherein the feedback signal comprises a signal edge which is triggered upon the analogue to digital converter finishing an analogue to digital conversion of a sample.

3. The circuit portion of claim 1, wherein the duty cycle of the second clock is determined by a signal edge of the feedback signal.

4. The circuit portion of claim 1, wherein a first signal edge of the second clock is triggered by a signal edge of the feedback signal and a second signal edge of the second clock is triggered by a signal edge of the first clock.

5. The circuit portion of claim 1, wherein the sampling module comprises a D-type flip flop.

6. The circuit portion of claim 5, comprising a re-sampling module clocked by the first clock arranged to re-sample the output of the sampling module.

7. The circuit portion of claim 1, comprising a re-sampling module clocked by the first clock arranged to re-sample the output of the sampling module.

8. The circuit portion of claim 1, wherein the re-sampling module comprises a D-type flip flop.

9. The circuit portion of claim 1, wherein the analogue to digital converter is a successive approximation register analogue to digital converter.

10. The circuit portion of claim 1, wherein the second clock is arranged to determine when the analogue to digital converter changes from a conversion mode to a sampling mode and wherein controlling the duty cycle of the second clock controls a duration of the sampling mode and a duration of the conversion mode.

11. The circuit portion of claim 1, wherein the analogue to digital converter comprises one or more internal latches, each internal latch being arranged to latch a bit once said bit has been converted.

12. The circuit portion of claim 11, the internal latch(es) being arranged to only reset on a signal edge of the second clock.

13. A method of operating a circuit portion, comprising:
clocking components in a clock domain with a first clock;
clocking an analogue to digital converter with a second clock, the second clock having a duty cycle, the second clock being derived from the first clock;
sampling an output of the analogue to digital converter using a sampling module clocked by the second clock;
after said sampling, re-sampling an output of the sampling module with a re-sampling module clocked by the first clock; and
outputting a feedback signal from the analogue to digital converter, upon finishing an analogue to digital conversion of a sample, to control the duty cycle.

* * * * *